(12) United States Patent
Siskavich

(10) Patent No.: US 8,455,290 B2
(45) Date of Patent: Jun. 4, 2013

(54) METHOD OF FABRICATING EPITAXIAL STRUCTURES

(75) Inventor: Brad M. Siskavich, Amherst, NH (US)

(73) Assignee: Masimo Semiconductor, Inc., Irvine, CA (US)

( * ) Notice: Subject to any disclaimer, the term of this patent is extended or adjusted under 35 U.S.C. 154(b) by 343 days.

(21) Appl. No.: 12/807,399

(22) Filed: Sep. 4, 2010

(65) Prior Publication Data

US 2012/0058591 A1    Mar. 8, 2012

(51) Int. Cl.
*H01L 31/18*    (2006.01)

(52) U.S. Cl.
USPC ............. 438/64; 438/66; 438/68; 438/93

(58) Field of Classification Search
None
See application file for complete search history.

(56) References Cited

U.S. PATENT DOCUMENTS

| | | | |
|---|---|---|---|
| 8,187,907 B1 * | 5/2012 | Newman | 438/66 |
| 8,236,600 B2 * | 8/2012 | Cornfeld | 438/74 |
| 2004/0166681 A1 * | 8/2004 | Iles et al. | 438/689 |
| 2005/0199281 A1 * | 9/2005 | Fatemi et al. | 136/255 |
| 2006/0185582 A1 * | 8/2006 | Atwater et al. | 117/89 |
| 2006/0185725 A1 * | 8/2006 | Fatemi et al. | 136/255 |
| 2010/0186822 A1 * | 7/2010 | Pan et al. | 136/261 |
| 2010/0263707 A1 * | 10/2010 | Cheong et al. | 136/244 |
| 2010/0326518 A1 * | 12/2010 | Juso et al. | 136/256 |
| 2011/0259936 A1 * | 10/2011 | Lichtensteiger | 225/1 |
| 2011/0287578 A1 * | 11/2011 | Wojtczuk et al. | 438/94 |
| 2011/0290312 A1 * | 12/2011 | Agui et al. | 136/255 |
| 2012/0058591 A1 * | 3/2012 | Siskavich | 438/68 |
| 2012/0138130 A1 * | 6/2012 | Guter et al. | 136/255 |

* cited by examiner

*Primary Examiner* — David E Graybill
(74) *Attorney, Agent, or Firm* — Knobbe, Martens, Olson & Bear LLP

(57) ABSTRACT

A method of fabricating epitaxial structures including applying an etch stop to one side of a substrate and then growing at least one epitaxial layer on a first side of said substrate, flipping the substrate, growing a second etch stop and at least one epitaxial layer on a second side of the substrate, applying a carrier medium to the ultimate epitaxial layer on each side, dividing the substrate into two parts generally along an epitaxial plane to create separate epitaxial structures, removing any residual substrate and removing the etch stop.

12 Claims, 3 Drawing Sheets

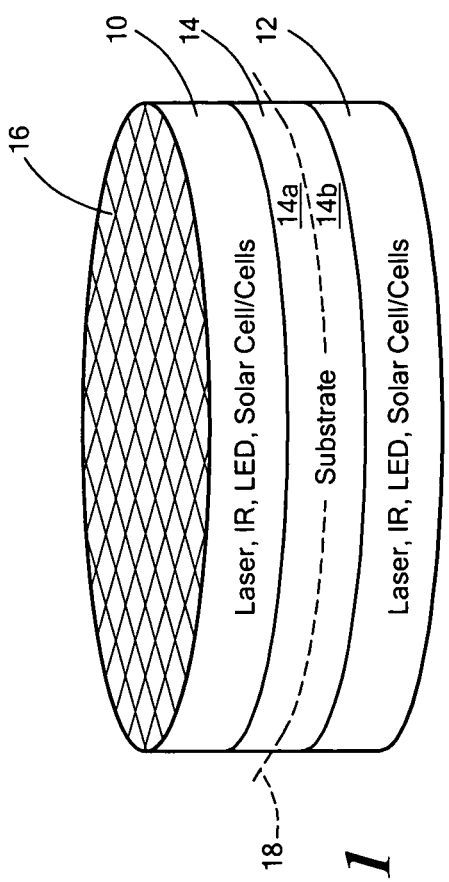
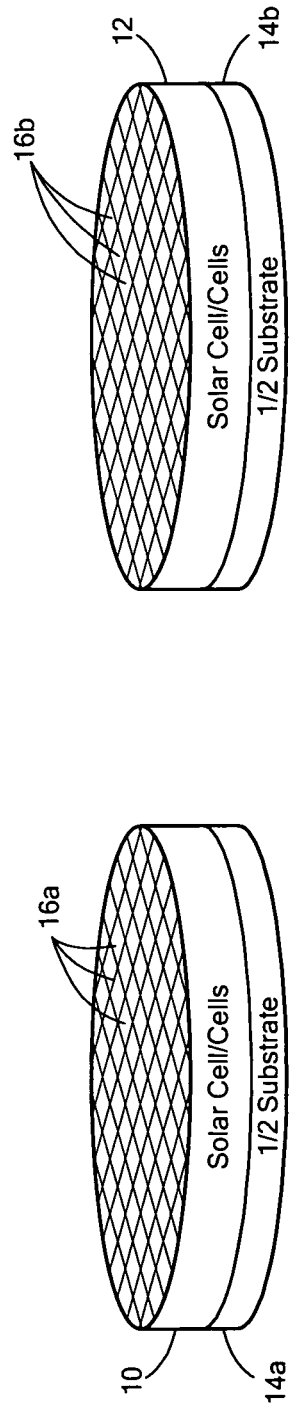
FIG. 1
FIG. 2
FIG. 3

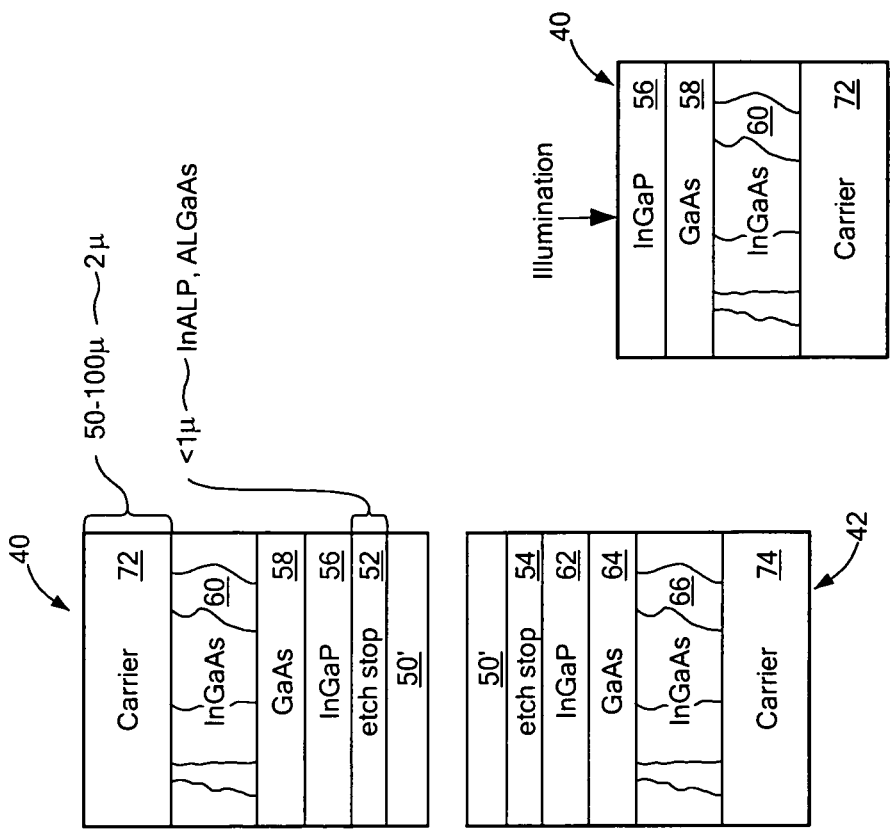
FIG. 8
FIG. 7
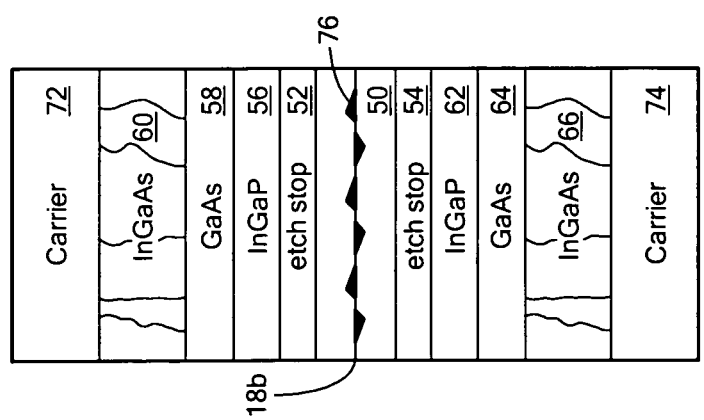
FIG. 6
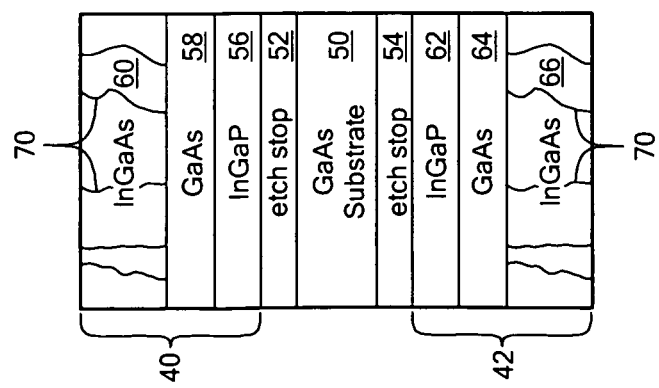
FIG. 5

METHOD OF FABRICATING EPITAXIAL STRUCTURES

FIELD OF THE INVENTION

This invention relates to a method of fabricating epitaxial devices.

BACKGROUND OF THE INVENTION

Fabricating epitaxial structures such as solar cells, LED's, lasers and IR cells is costly and complex. Solar cells have been fabricated forming inverted metamorphic (IMM) cells, by depositing the layers such as InGaP, GaAs, and InGaAs on a wafer or substrate such as GaAs often resulting in an array of a multiplicity of solar cells and then applying a carrier and removing the substrate by side etching it away. This process is slow and difficult and can result in poor and inconsistent performance. After removal of the substrate the processed epitaxial layers may be sawed into the individual solar cells. Solar cells have also been made by singulating the multiplicity of cells on, for example, a four inch wafer and then applying a carrier. The individual cells are then lifted off the substrate by etching along the singulation lines and underneath the individual cells This process is not optimal for mounting onto metal carriers and the individual cells so formed are difficult to process and handle. Often another material such as epoxy is incorporated, and further processing as well as final cell performance may be limited. Another shortcoming of such processing is that the wafers or substrates on which the epitaxial layers are grown, is often damaged or rendered unable to be reused, eliminating the cost benefits of epitaxial removal and substrate reuse.

SUMMARY OF THE INVENTION

In accordance with various aspects of the subject invention in at least one embodiment the invention presents an improved method of fabricating epitaxial structures which reduces the number of substrates required for the fabrication process by a factor of two and which admits of a simple and direct removal of the substrate, and the use of a number of different carriers including metals, which does not require singulation before separation from the substrate, and is compatible with further processing.

The subject invention results from the realization that, in part, an improved method of fabricating epitaxial structures in various aspects can be achieved by applying an etch stop layer and growing at least one epitaxial layer on each side; applying a carrier to the ultimate layer on each side and then dividing the substrate into two parts generally along an epitaxial plane to create two separate epitaxial structures from a single substrate.

The subject invention, however, in other embodiments, need not achieve all these objectives and the claims hereof should not be limited to structures or methods capable of achieving these objectives.

This invention features a method of fabricating epitaxial structures including applying an etch stop to one side of a substrate and then growing at least one epitaxial layer on a first side of the substrate, flipping the substrate, growing a second etch stop and at least one epitaxial layer on a second side of the substrate, applying a carrier medium to the ultimate epitaxial layer on each side, dividing the substrate into two parts generally along an epitaxial plane to create separate epitaxial structures, removing any residual substrate and removing the etch stop.

In a preferred embodiment the epitaxial structures may include solar cells. The solar cells may include inverted metamorphic structures. The solar cells may include inverted triple junction tandem solar cells. Each solar cell may include lattice matched top and middle layers and a lattice mismatched bottom layer. The lattice mismatched bottom layer may include InGaAs, and the top and middle layers may include InGaP and GaAs, respectively. The lattice mismatched bottom layer may include lattice matched 1 eV, and the top and middle layers may include lattice matched 1.9 eV and lattice matched 1.42 eV, respectively. The carrier medium may include a material from the group of silicon, metal or glass. The carrier medium may include a metal from the group of gold, silver, copper, nickel, titanium or platinum. Dividing the substrate into two parts may include cutting using a wire saw or laser. Each epitaxial structure may include an array of a multiplicity of individual cells. The method may further include separating the array of a multiplicity of cells in each epitaxial structure into the individual cells.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 1 is a three dimensional diagrammatic view of two epitaxial structures formed on opposite sides of a substrate according to one embodiment of this invention;

FIGS. 2 and 3 are views, similar to FIG. 1, of the epitaxial structures after they have been separated by dividing the common substrate along an epitaxial plane;

FIGS. 5, 6 and 7 are more detailed schematic side sectional views of the bi-facial growth substrate during saw, etch stop, and residual substrate removal steps, respectively, according to one embodiment of the fabrication method of this invention; and FIG. 8 is a view similar to FIGS. 5, 6, and 7 of one of the two resulting epitaxial structures formed in the operations of FIGS. 5, 6, and 7.

DETAILED DESCRIPTION OF THE INVENTION

Figure 4:
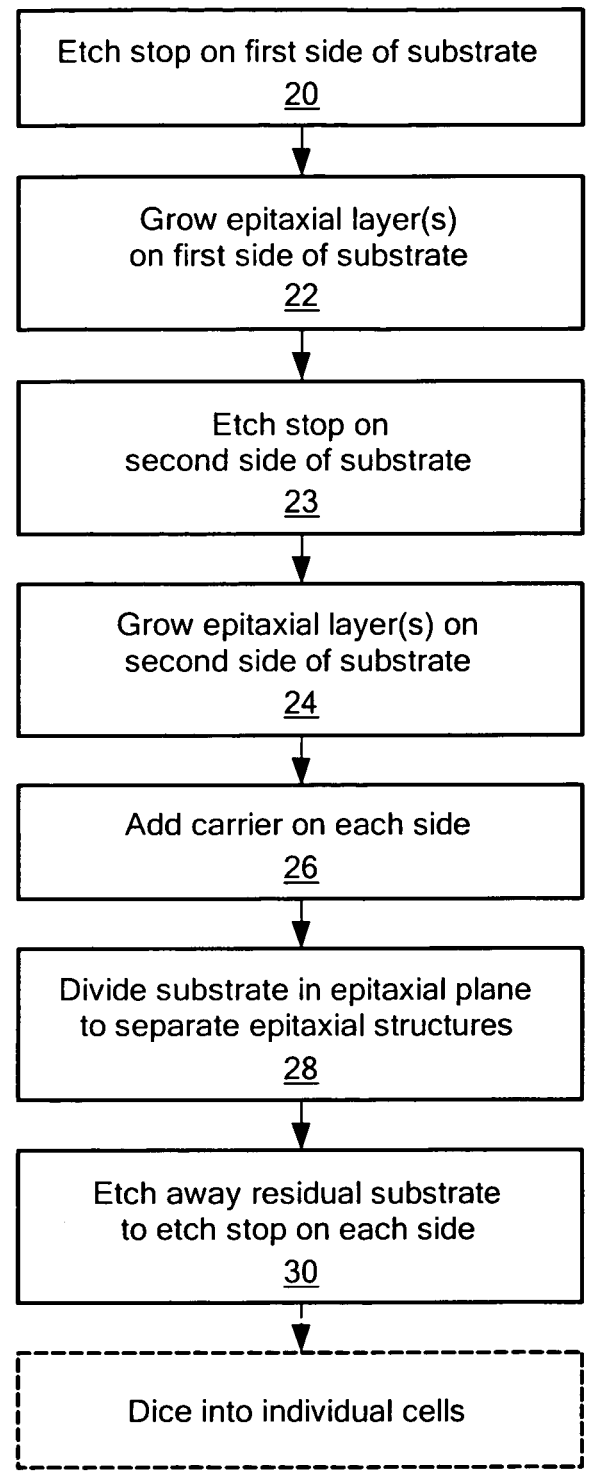
FIG. 4 is a block diagram of one embodiment of a method of fabrication according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The method of fabricating epitaxial structures according to this invention in one embodiment employs bi-facial epitaxial growth where both the bottom and the top of the semiconductor wafer or substrate is processed into separate epitaxial structures. The notion is to grow epistructures on one side of the wafer or substrate and then grow a similar epistructure on the opposite side of the substrate. This is done by stopping the growth after one epistructure is complete flipping the substrate and carrying out the growth of a second same or similar epistructure on the opposite side of the substrate. In this way two sets of epitaxial structures can be grown on a single common substrate, thereby reducing the number of substrates required by a factor of two.

There is shown in FIG. 1 a pair of epitaxial structures 10, 12 grown on a single common substrate 14. The epitaxial structure may contain one or more laser, IR, LED, or solar cell or cells. For example, substrate 14 may be a typical four inch diameter wafer or substrate and the epitaxial structure 10 may include an array of a multiplicity of individual devices or chips 16 which are subsequently diced or sawn apart perpendicular to the epitaxial plane as a part of the processing. After the growth of the epitaxial structures 10 and 12 on substrate 14 has been completed substrate 14 is divided, according to one embodiment of this invention, along an epitaxial plane 18 separating the two epitaxial structures 10 and 12 as shown in FIGS. 2 and 3.

A method of accomplishing the results suggested by FIGS. 1, 2 and 3 is shown in FIG. 4. An etch stop layer and then an epitaxial layer or layers are grown on the first side of the substrate 22, after which the substrate is flipped and a second etch stop layer and one or more epitaxial layers are grown on the opposite side of the substrate 24. A metallization or dielectric layer, considered a carrier, is added 26 to the ultimate epitaxial layer on each side. Then the substrate is divided 28 to separate the two epitaxial structures. The residual substrate and etch stop is removed 30. If the epitaxial structures 10 and 12 actually contain an array of a multiplicity of individual cells 16, 16a, 16b then each of the epitaxial structures may be processed and then diced or sawn into the individual devices. One use of the method according to this invention would be in the growth of inverted triple junction tandem solar cell structures. More particularly perhaps to two three junction inverted tandem cells in which the lattice match top and middle cells in addition to a lattice mismatch bottom In GaAs cell are grown on one side of the wafer and the same structure is then grown on the opposite side. The ultimate layer on both sides of the wafer or substrate is then metallized that is a carrier medium is formed on it using for example a conventional back-metal approach. Once the carrier is in place the substrate may be divided along an epitaxial plane, a plane generally parallel to the epitaxial plane. For example it may be sawn in two using a laser or diamond wire sawing method to separate the two epitaxial structures and create two separate devices. The two epitaxial structures may then be processed in a conventional manner as two separate substrates containing epitaxial growth which will be processed and diced into inverted metamorphic (IMM) solar cells.

Such an approach is shown in FIGS. 5, 6 and 7. In FIG. 5 a GaAs substrate 50 which may be 150 to 700 microns in thickness receives an etch stop layer 52. The etch stop 52 may be one micron or less in thickness and may be composed of such materials as InAlP, or AlGaAs. Then an epitaxial layer 56 of InGaP is grown on etch stop 52. A GaAs epitaxial layer 58 is grown on layer 56 and an InGaAs epitaxial layer 60 is grown on layer 58. Layers 56, 58 and 60 may be referred to as IMM or inverted metamorphic device. At this point substrate 50 would be flipped and an etch stop layer 54 and an epitaxial layer 62 of InGaP would be grown after which would be grown epitaxial layer 64 of GaAs and epitaxial layer 66 of InGaAs. The irregular lines 70 in layers 60 and 66 represent stress lines that typically can occur in InGaAs layers. By making these layers the last layer deposited, the stress lines and the resulting poor qualities associated therewith will not be communicated to the accompanying GaAs 58, 64 and InGaP 56 and 62 epitaxial layers. In the specific example shown in FIG. 5 layers 52, 56, 58 and 60 may be referred to as an epitaxial structure as may the epitaxial layers 54, 62, 64, and 66. After the bi-facial growth in FIG. 5, carrier mediums 72, 74, are added, FIG. 6. The carrier mediums may be 50-1000 microns thick and may be made of silicon wafer material, metal such as gold, silver, copper, nickel, titanium, platinum, silicon nitride or glass. Metal is often the preferred carrier medium; however in many devices a carrier transparent to wavelengths of light may be desired. Substrate 50 is sawn in two along an epitaxial plane 18b as shown by the rough saw marks 76. With the epitaxial structures separated, FIG. 7, the remaining GaAs substrate material 50' is removed and then the etch stops 52, and 54. Each of the epitaxial structures 40, 42 may then be processed as conventional IMM, inverted metamorphic devices, and can be used as a typical solar cell as shown in FIG. 8.

The bi-facial epitaxial growth specifically shown as inverted triple junction solar cells in FIGS. 5-8 on each side of the substrate 50 use lattice matched 1.9 eV InGaP epitaxial layers 56 and 62 and lattice matched 1.42 eV GaAs epitaxial layers 58 and 64 and ~2% of lattice mismatched 1 eV InGaAs epitaxial layers 60 and 66.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A method of fabricating epitaxial structures, the method comprising:
   growing a first etch stop on a first side of a substrate;
   growing at least one epitaxial layer on the first side of the substrate;
   flipping the substrate;
   growing a second etch stop on a second side of the substrate;
   growing at least one epitaxial layer on the second side of the substrate;
   applying a carrier medium to the first and second sides of the substrate;
   dividing the substrate into two parts generally along an epitaxial plane to create a first epitaxial structure and a second epitaxial structure;
   removing residual substrate from the first and second epitaxial structures; and
   removing the first and second etch stops.

2. The method of claim 1, wherein the first and second epitaxial structures comprise solar cells.

3. The method of claim 2, wherein the solar cells comprise inverted metamorphic structures.

4. The method of claim 2, wherein the solar cells comprise inverted triple junction tandem solar cells.

5. The method of claim 4, wherein each solar cell comprises a top layer, a middle layer and a bottom layer, the top layer and the middle layer having matching lattice structures, the middle layer and the bottom layer not having matching lattice structures.

6. The method of claim 5, wherein the bottom layer comprises InGaAs, the middle layer comprises GaAs, and the top layer comprises InGaP.

7. The method of claim 5, wherein the bottom layer has a bandgap of approximately 1 eV, the middle layer has a bandgap of approximately 1.42 eV, and the top layer has a bandgap of approximately 1.9 eV.

8. The method of claim 1, wherein the carrier medium comprises at least one of silicon, metal, and glass.

9. The method of claim 8, wherein the carrier medium comprises at least one of gold, silver, copper, nickel, titanium, and platinum.

10. The method of claim 1, wherein dividing the substrate into two parts comprises cutting the substrate using a wire saw or a laser.

11. The method of claim 1, wherein each of the first and second epitaxial structures comprises an array of individual cells.

12. The method of claim 11, further comprising separating the array of individual cells of each of the first and second epitaxial structures into the individual cells.

* * * * *